United States Patent
Kuo

(10) Patent No.: US 7,872,515 B1
(45) Date of Patent: Jan. 18, 2011

(54) PHASE INTERPOLATION DEVICE AND SLEW RATE CONTROL DEVICE THEREOF

(75) Inventor: Chun-Cheng Kuo, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/606,436

(22) Filed: Oct. 27, 2009

(51) Int. Cl.
H03H 11/16 (2006.01)
(52) U.S. Cl. ...................... 327/237; 327/231
(58) Field of Classification Search ........................ None
See application file for complete search history.

(56) References Cited

U.S. PATENT DOCUMENTS

| | | | |
|---|---|---|---|
| 6,417,705 B1 * | 7/2002 | Tursi et al. | 327/158 |
| 6,509,780 B1 * | 1/2003 | Lim et al. | 327/378 |
| 6,538,464 B2 * | 3/2003 | Muljono et al. | 326/27 |
| 6,958,634 B2 * | 10/2005 | Rashid | 327/141 |
| 7,049,872 B2 * | 5/2006 | Diorio et al. | 327/276 |
| 7,202,702 B2 * | 4/2007 | Arnold et al. | 326/87 |
| 7,555,668 B2 * | 6/2009 | Murtagh et al. | 713/503 |
| 7,821,289 B2 * | 10/2010 | Lee | 326/27 |

* cited by examiner

Primary Examiner—Cassandra Cox
(74) Attorney, Agent, or Firm—Thomas, Kayden, Horstemeyer & Risley

(57) ABSTRACT

A phase interpolation device and a slew rate control device thereof. The slew rate control device comprises a slew rate control circuit, source followers and a comparator. The slew rate control circuit receives clock signals and a control signal, and adjusts slew rate of the clock signals according to the control signal. The source followers each comprise an input terminal and an output terminal. The input terminals of the source followers are coupled to the slew rate control circuit to receive the adjusted clock signals, respectively. The output terminals of the source followers are connected together at a node. The comparator has a first input terminal coupled to the node, a second input terminal receiving a voltage reference, and an output terminal providing the control signal for the slew rate control circuit. The setting of the voltage reference is dependent on the desired slew rate of the adjusted clock signals.

14 Claims, 4 Drawing Sheets

Average voltage = $[(1-X/2) \times V_t / V_b - X/2] \times V_b = \text{gain} \times V_b$

PHASE INTERPOLATION DEVICE AND SLEW RATE CONTROL DEVICE THEREOF

BACKGROUND OF THE INVENTION

1. Field of the Invention

The present invention relates to phase interpolation devices and slew rate control devices thereof.

2. Description of the Related Art

In a computing system, data may be transmitted by a data stream, and at least one clock signal is available in the computing system for recovering data from the data stream. However, there may be a delay while transmitting the data stream, so that a phase shift may occur between the data stream and the clock signal. When the phase shift exceeds an allowable limit, a phase interpolation technique is required in the computing system to generate new clock signals with phases different from the available clock signals.

FIG. 1A shows a conventional phase interpolation circuit, which comprises two logic gates LG1 and LG2. The logic gates LG1 and LG2 may be inverters or current mode logic circuits (CML circuits) or any circuits capable of buffering the input signals. As shown, clock signals $clk_i$ and $clk_q$ (originally provided in the computing system, where $clk_i$ is an in-phase clock signal and $clk_q$ is a quadrature clock signal, and the quadrature clock signal $clk_q$ lags behind the in-phase clock signal $clk_i$ by 90 degrees) are input to the logic gates LG1 and LG2, respectively, and the output terminals of the logic gates LG1 and LG2 are connected together to provide a phase interpolated signal $clk_{new}$. Compared with the clock signals $clk_i$ and $clk_q$, the phase interpolated signal $clk_{new}$ lags behind the in-phase clock signal $clk_i$ and leads the quadrature clock signal $clk_q$.

The structure of the logic gate LG1 may be identical to that of the logic gate LG2. For such cases, FIG. 1B depicts the phase difference between the clock signals $clk_i$ and $clk_q$ and the phase interpolated clock signal $clk_{new}$. As shown, the phase of the phase interpolated signal $clk_{new}$ is read according to the reference line 102. The phase interpolated signal $clk_{new}$ lags behind the in-phase clock signal $clk_i$ by 45 degrees and leads the quadrature clock signal $clk_q$ by 45 degrees.

However, the phase interpolation circuits can only handle clock signals rising or falling at limited speeds. If the clock signals rise or fall faster than a threshold speed, the phase interpolation circuits may fail to generate the phase interpolated clock signal. Thus, phase interpolation devices with slew rate control techniques are called for.

BRIEF SUMMARY OF THE INVENTION

The invention discloses phase interpolation devices and slew rate control devices thereof.

An exemplary embodiment of the phase interpolation device comprises a slew rate control circuit, a phase interpolation circuit, a plurality of first source followers and a comparator. The slew rate control circuit receives a plurality of clock signals and a control signal, and adjusts slew rate of the clock signals according to the control signal. The phase interpolation circuit is coupled to the slew rate control circuit to receive the adjusted clock signals, and to generate a phase interpolated clock signal according to the adjusted clock signals. The first source followers each comprise an input terminal and an output terminal. The input terminals of the first source followers are coupled to the slew rate control circuit to receive the adjusted clock signals, respectively. The output terminals of the first source followers are connected together at a first node. The comparator has a first input terminal coupled to the first node, a second input terminal receiving a voltage reference, and an output terminal providing the control signal for the slew rate control circuit. The voltage reference is set according to a desired slew rate in which the phase interpolation circuit can handle. Under the control of the control signal generated by the comparator, the adjusted clock signals can be forced to the desired slew rate.

In other embodiments, the slew rate control circuit, the first source followers and the comparator in the phase interpolation device may form a slew rate control device. Note that the slew rate control device is not limited to be applied in the phase interpolation techniques.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
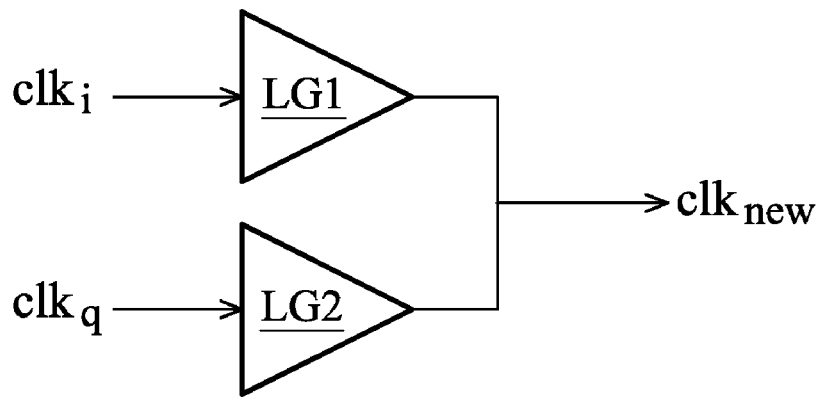
FIG. 1A shows a conventional phase interpolation circuit.
Figure 1B:
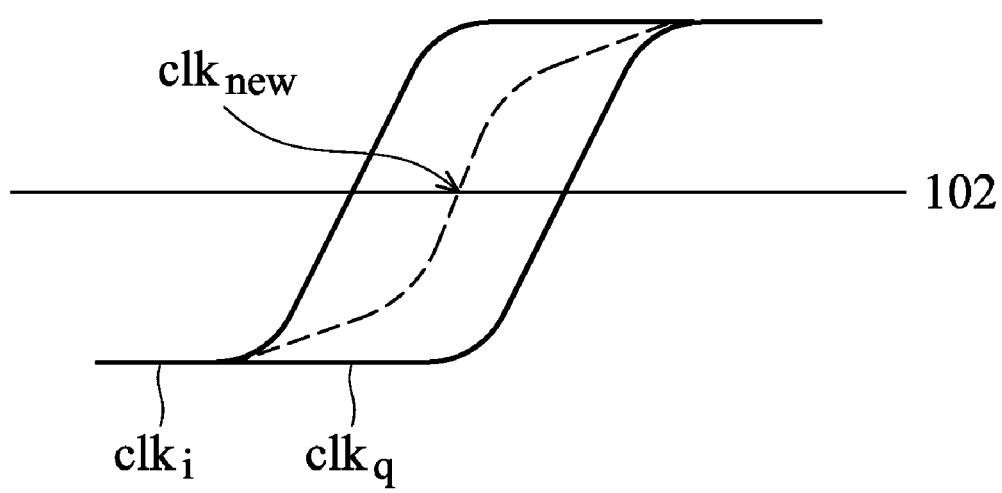
FIG. 1B depicts the phase difference between clock signals $clk_i$ and $clk_q$ and a phase interpolated clock signal $clk_{new}$.
Figure 2:
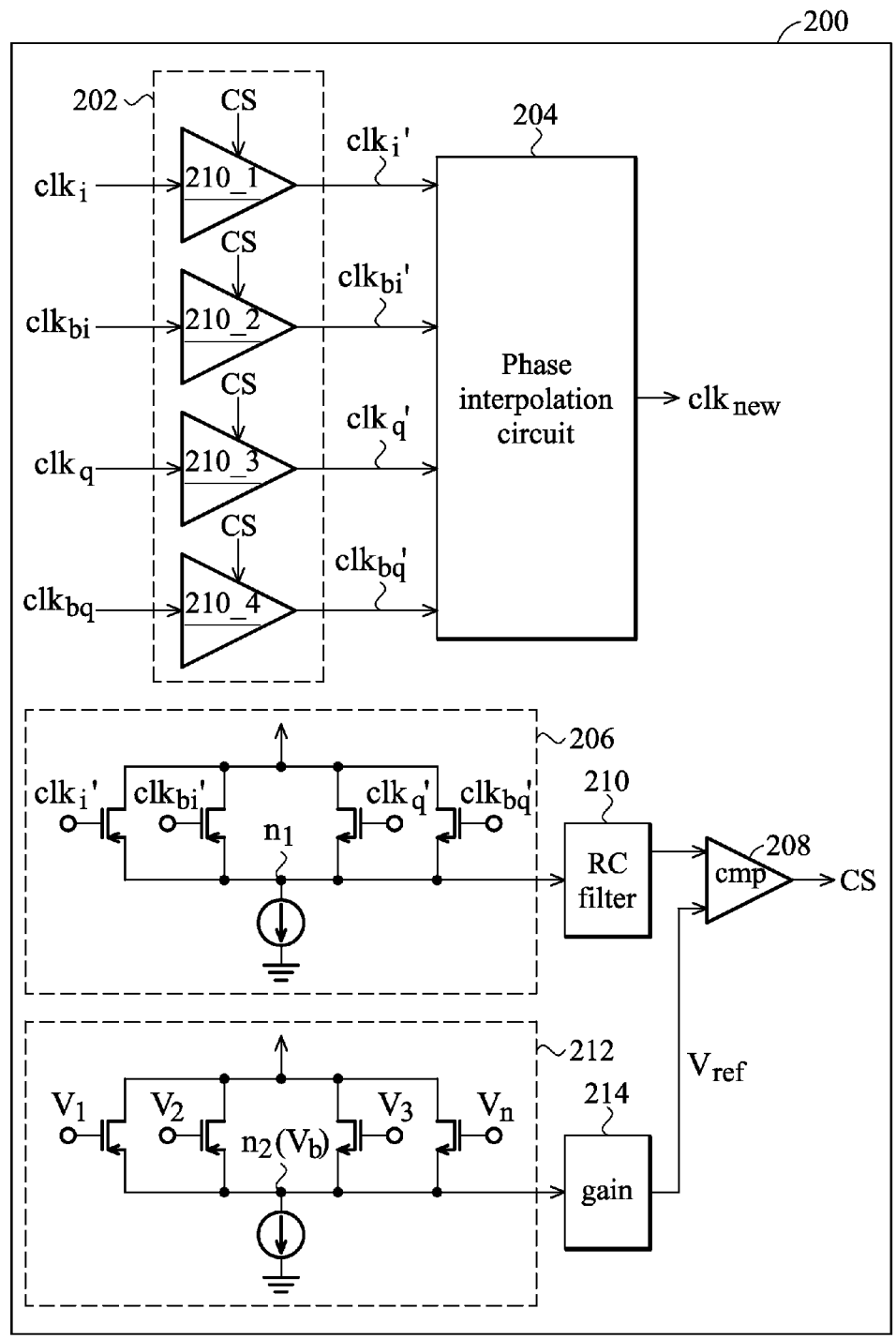
FIG. 2 depicts an exemplary embodiment of the phase interpolation device of the invention.

FIG. 2 depicts an exemplary embodiment of the phase interpolation device of the invention. The phase interpolation device 200 comprises a slew rate control circuit 202, a phase interpolation circuit 204, a plurality of first source followers (included in block 206), and a comparator 208.

The slew rate control circuit 202 is designed to adjust the clock signals $clk_i$, $clk_{bi}$, $clk_q$ and $clk_{bq}$ to a desired slew rate that the phase interpolation circuit 204 can handle. The slew rate control circuit 202 receives the clock signals $clk_i$, $clk_{bi}$, $clk_q$ and $clk_{bq}$ and a control signal CS, and adjusts the slew rate of the clock signals $clk_i$, $clk_{bi}$, $clk_q$ and $clk_{bq}$ according to the control signal CS. Note that the phase interpolation circuit 204 may be implemented by any phase interpolation technique known by those skilled in the art. The phase interpolation circuit 204 outputs a phase interpolated clock signal $clk_{new}$ according to the adjusted clock signals $clk_i'$, $clk_{bi}'$, $clk_q'$ and $clk_{bq}'$.

This paragraph recites embodiments of the slew rate control circuit 202. As shown in FIG. 2, the slew rate control circuit 202 may comprises a plurality of logic gates 210_1, 210_2, 210_3 and 210_4. The logic gates 210_1 ... 210_4 may have identical structures. For example, the logic gates 210_1 ... 210_4 may be inverters, current mode logic circuits (CML circuits), or any circuits capable of buffering their input signals. In the embodiments wherein the logic gates 210_1 ... 210_4 are inverters, the current source of the inverters may be adjustable and is adjusted according to the control signal CS, so that the slew rate of the clock signals $clk_i$, $clk_{bi}$, $clk_q$ and $clk_{bq}$ is adjusted and the adjusted clock signals $clk_i'$, $clk_{bi}'$, $clk_q'$ and $clk_{bq}'$ are generated. In the embodiments wherein the logic gates 210_1 ... 210_4 are CML circuits, the capacitors or resistors coupled at the output terminals of the CML circuits are adjustable and are adjusted according to the control signal CS so that the slew rate of the clock signals $clk_i$, $clk_{bi}$, $clk_q$ and $clk_{bq}$ is adjusted and the adjusted clock signals $clk_i'$, $clk_{bi}'$, $clk_q'$ and $clk_{bq}'$ are generated.

The invention further discloses techniques for generating the control signal CS for the slew rate control circuit 202. Referring to the embodiment of FIG. 2, the first source followers (in block 206) and the comparator 208 are designed to generate the control signal CS for the slew rate control circuit 202. Each of the first source followers has an input terminal and an output terminal. Referring to block 206 of FIG. 2, the input terminals of the first source followers receive the adjusted clock signals $clk_i'$, $clk_{bi}'$, $clk_q'$ and $clk_{bq}'$, respectively, and the output terminals of the first source followers are connected together at a first node $n_1$. Thus, the voltage waveform at the first node $n_1$ reflects the slew rate of the adjusted clock signals $clk_i'$, $clk_{bi}'$, $clk_q'$ and $clk_{bq}'$. To determine whether the slew rate of the adjusted clock signals $clk_i'$, $clk_{bi}'$, $clk_q'$ and $clk_{bq}'$ is within a range that the phase interpolation circuit 204 can handle, the first node $n_1$ is coupled to the comparator 208 to be compared with a voltage reference $V_{ref}$. The setting of the voltage reference $V_{ref}$ is based on the desired slew rate that the phase interpolation circuit 204 can handle. Thus, the generated control signal CS can force the slew rate control circuit 202 to output clock signals of an appropriate slew rate.

FIG. 2 further shows an optional component—a RC filter 210. The RC filter 210 may be a low pass filter and may be coupled between the first node $n_1$ and the comparator 208. The RC filter 210 is designed to obtain the dc voltage at the first node $n_1$. It may improve the performance of the slew rate control.

The embodiment shown in FIG. 2 further discloses a circuit providing the voltage reference $V_{ref}$, wherein, second source followers (included in block 212) are disclosed. The second source followers in block 212 and the first source followers in block 206 have identical structures. Referring to block 212 of FIG. 2, the input terminals of the second source followers are designed to receive specific voltage signals and the output terminals of the second source followers are connected together at a second node $n_2$. The second node $n_2$ is coupled to the comparator 208 to provide the voltage reference $V_{ref}$. The voltage signals input to the second source followers are specially designed. Furthermore, a programmable gain amplifier 214 (optional) may be coupled between the second node $n_2$ and the comparator 208, to fine tune the voltage level at the second node $n_2$.

After the discussion of the structures of the phase interpolation device 200, the following further discusses the signals in the phase interpolation device 200. Generally, the available clock signals in a computing system have specific phase shifts: 0 degree (in-phase clock signal), 90 degrees (quadrature clock signal), 180 degrees and 270 degrees. The four available clock signals are input to the phase interpolation device 200, as shown in FIG. 2, the clock signal $clk_i$ is the in-phase clock signal, the clock signal $clk_q$ is the quadrature clock signal, the clock signal $clk_{bi}$ lags the clock signal $clk_i$ by 180 degrees and the clock signal $clk_{bq}$ lag the clock signal $clk_q$ by 180 degrees. In addition, the phase interpolation device 200 requires another three inputs: a first voltage value $V_1$, a second voltage value $V_2$ and a third voltage value $V_3$. The another three inputs are forced to the second source followers of block 212. As shown, one of the second source followers receives the first voltage value $V_1$, another one of the second source followers receives the second voltage value $V_2$, and the rest two of the second source followers both receive the third voltage value $V_3$. The first voltage $V_1$ may be a peak voltage of the adjusted clock signals $clk_i'$, $clk_{bi}'$, $clk_q'$ and $clk_{bq}'$, the second voltage $V_2$ may be a bottom voltage of the adjusted clock signals $clk_i'$, $clk_{bi}'$, $clk_q'$ and $clk_{bq}'$, and the third voltage $V_3$ may be a common voltage of the adjusted clock signals $clk_i'$, $clk_{bi}'$, $clk_q'$ and $clk_{bq}'$ and thus the voltage level at the second node $n_2$ may equal to the bottom voltage $V_b$ of the voltage signal at the first node $n_1$. In this embodiment, the programmable gain amplifier 214 may be designed to provide a gain of $(1-X/2)*V_t/V_b - X/2$, where X (between 0~1) reflects a slew rate of the adjusted clock signals $clk_i'$, $clk_{bi}'$, $clk_q'$ and $clk_{bq}'$ and $V_t$ is the peak voltage of the voltage signal at the first node $n_1$.

Figure 3A:
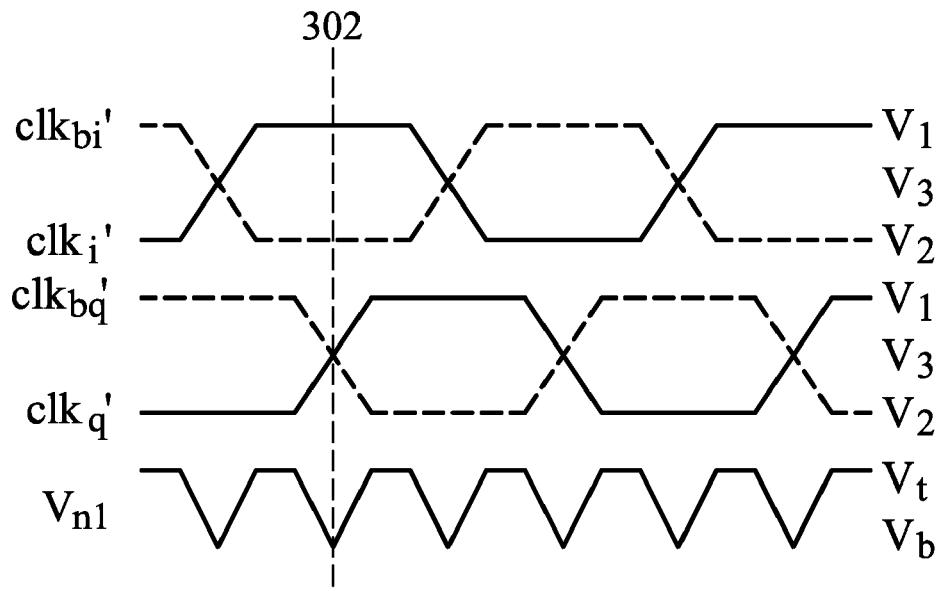
FIGS. 3A and 3B show examples depicting first, second and third voltage levels $V_1$, $V_2$ and $V_3$, and depicting a peak voltage level $V_t$ and a bottom voltage level $V_b$ at a first node $n_1$ of FIG. 2.
Figure 3B:
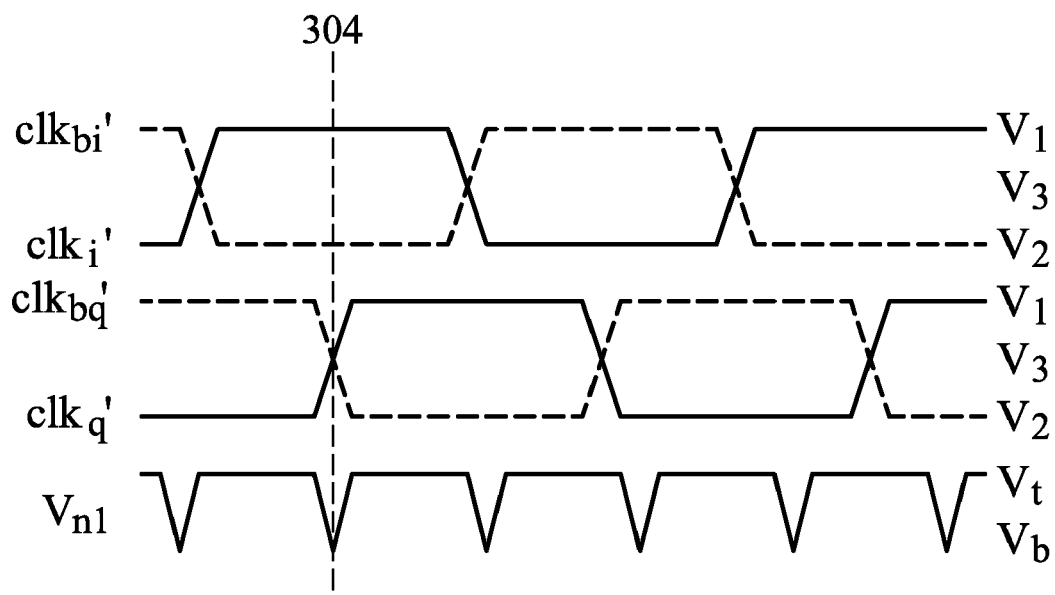
Figure 4:
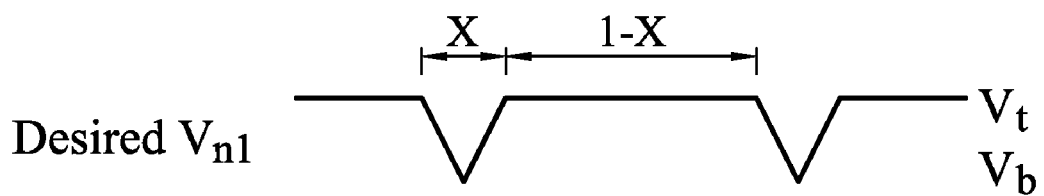
FIG. 4 depicts a parameter X used in defining a gain provided by a programmable gain amplifier 214 of FIG. 2.

FIGS. 3A and 3B show examples depicting the first, second and third voltage levels $V_1$, $V_2$ and $V_3$, and depicting the peak voltage level $V_t$ and the bottom voltage level $V_b$ at the first node $n_1$. FIG. 4 depicts the parameter X used in defining the gain provided by the programmable gain amplifier 214.

Referring to FIGS. 3A and 3B, the inputs ($clk_i'$, $clk_{bi}'$, $clk_q'$ and $clk_{bq}'$) and the output ($V_{n1}$) of the first source followers of block 206 of FIG. 2 are shown, wherein the signals of FIG. 3A has a slew rate slower than that of the signals of FIG. 3B. The adjusted clock signals $clk_i'$, $clk_{bi}'$, $clk_q'$ and $clk_{bq}'$ have a peak voltage $V_1$, a bottom voltage $V_2$, and a common voltage $V_3$. The voltage waveform $V_{n1}$ has a peak voltage $V_t$, a bottom voltage $V_b$. According to lines 302 and 304, the first node $n_1$ is at its bottom voltage $V_b$ while one of the adjusted clock signals is at the first voltage $V_1$, another is at the second voltage $V_2$, and the rest are at the third voltage $V_3$. Thus, referring back to the second source followers included in block 212 of FIG. 2, a duplicate of the bottom voltage $V_b$ of the first node $n_1$ is generated at the second node $n_2$.

Note that the slew rate of the adjusted clock signals $clk_i'$, $clk_{bi}'$, $clk_q'$ and $clk_{bq}'$ of FIG. 3A is slower than that of the adjusted clock signals $clk_i'$, $clk_{bi}'$, $clk_q'$ and $clk_{bq}'$ of FIG. 3B, and the voltage waveform $V_{n1}$ of FIG. 3A has a slower slew rate compared with the voltage waveform $V_{n1}$ of FIG. 3B. The voltage waveform $V_{n1}$ at the first node $n_1$ reflects the slew rate of the adjusted clock signals $clk_i'$, $clk_{bi}'$, $clk_q'$ and $clk_{bq}$. The slew rate of the adjusted clock signals $clk_i'$, $clk_{bi}'$, $clk_q'$ and $clk_{bq}'$ can be properly adjusted to a desired value when the voltage waveform $V_{n1}$ at the first node $n_1$ is adjusted to a desired waveform.

FIG. 4 shows a desired voltage waveform (desired $V_{n1}$) at the first node $n_1$. The slew rate of the desired $V_{n1}$ is determined by parameter X. The average voltage of the desired $V_{n1}$ is $[(1-X/2)*V_t/V_b - X/2]*V_b$. To drive the voltage signal at the first node $n_1$ to approach the desired $V_{n1}$ shown in FIG. 4, the voltage reference $V_{ref}$ has to be set to $[(1-X/2)*V_t/V_b - X/2]*V_b$. Because the voltage level at the second node $n_2$ is maintained at $V_b$, the programmable gain amplifier 214 is designed to provide a gain, $[(1-X/2)*V_t/V_b - X/2]$. Thus, the voltage waveform $V_{n1}$ at the first node $n_1$ approaches the desired $V_{n1}$ shown in FIG. 4, meanwhile, the slew rate of the adjusted clock signals $clk_i'$, $clk_{bi}'$, $clk_q'$ and $clk_{bq}'$ is adjusted to the desired value.

Referring back to FIG. 2, the slew rate control circuit 202, the first source followers of block 206 and the comparator 208 may form a slew rate control device. The slew rate control device is not limited to be applied in the phase interpolation techniques and it may be applied in other applications. Furthermore, the slew rate control device may further comprises the RC-filter 210, the second source followers (212), or the programmable gain amplifier 214 of FIG. 2.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase interpolation device, comprising
a slew rate control circuit, receiving a plurality of clock signals and a control signal, and adjusting slew rate of the clock signals according to the control signal;
a phase interpolation circuit, receiving the adjusted clock signals to generate a phase interpolated clock signal;
a plurality of first source followers each comprising an input terminal and an output terminal, wherein the input terminals of the first source followers are coupled to the slew rate control circuit to receive the adjusted clock signals, respectively, and the output terminals of the first source followers are connected together at a first node; and
a comparator, having a first input terminal coupled to the first node, a second input terminal receiving a voltage reference, and an output terminal providing the control signal for the slew rate control circuit.

2. The phase interpolation device as claimed in claim 1, further comprising an RC-filter coupled between the first node and the first input terminal of the comparator.

3. The phase interpolation device as claimed in claim 1, wherein the amount of the clock signals is four, and the first clock signal leads the second clock signal by 180 degrees, leads the third clock signal by 90 degrees, and leads the fourth clock signal by 270 degrees.

4. The phase interpolation device as claimed in claim 3, further comprising four second source followers each comprising an input terminal and an output terminal,
wherein:
the input terminals of the second source followers receive a first voltage, a second voltage, a third voltage and the third voltage, respectively, and the output terminals of the second source followers are coupled together at a second node;
the second node is coupled to the second input terminal of the comparator; and
the first voltage is a peak voltage level of the adjusted clock signals, the second voltage is a bottom voltage level of the adjusted clock signals, and the third voltage is a common mode voltage of the adjusted clock signals.

5. The phase interpolation device as claimed in claim 4, further comprising a programmable gain amplifier coupled between the second node and the second input terminal of the comparator, wherein a gain provided by the programmable gain amplifier depends on a desired slew rate of the clock signals.

6. The phase interpolation device as claimed in claim 1, wherein:
the slew rate control circuit comprises a plurality of inverters; and
the inverters receive the clock signals, respectively, and each is powered by an adjustable current source that is controlled by the control signal.

7. The phase interpolation device as claimed in claim 1, wherein:
the slew rate control circuit comprises a plurality of current mode logic circuits; and
the current mode logic circuits receive the clock signals, respectively, and each has at least one adjustable resistor or at least one adjustable capacitor that is controlled by the control signal.

8. A slew rate control device, comprising
a slew rate control circuit, receiving a plurality of clock signals and a control signal, and adjusting slew rate of the clock signals according to the control signal;
a plurality of first source followers each comprising an input terminal and an output terminal, wherein the input terminals of the first source followers are coupled to the slew rate control circuit to receive the adjusted clock signals, respectively, and the output terminals of the first source followers are connected together at a first node; and
a comparator, having a first input terminal coupled to the first node, a second input terminal receiving a voltage reference, and an output terminal providing the control signal for the slew rate control circuit.

9. The slew rate control device as claimed in claim 7, further comprising an RC-filter coupled between the first node and the first input terminal of the comparator.

10. The slew rate control device as claimed in claim 8, wherein the amount of the clock signals is four, and the first clock signal leads the second clock signal by 180 degrees, leads the third clock signal by 90 degrees, and leads the fourth clock signal by 270 degrees.

11. The slew rate control device as claimed in claim 10, further comprising four second source followers each comprising an input terminal and an output terminal,
wherein:
the input terminals of the second source followers receive a first voltage, a second voltage, a third voltage and the third voltage, respectively, and the output terminals of the second source followers are coupled together at a second node;
the second node is coupled to the second input terminal of the comparator; and
the first voltage is a peak voltage level of the adjusted clock signals, the second voltage is a bottom voltage level of the adjusted clock signals, and the third voltage is a common mode voltage of the adjusted clock signals.

12. The slew rate control device as claimed in claim 10, further comprising a programmable gain amplifier coupled between the second node and the second input terminal of the comparator, wherein a gain provided by the programmable gain amplifier depends on a desired slew rate of the clock signals.

13. The slew rate control device as claimed in claim 8, wherein:
the slew rate control circuit comprises a plurality of inverters; and
the inverters receive the clock signals, respectively; and each is powered by an adjustable current source that is controlled by the control signal.

14. The slew rate control device as claimed in claim 8, wherein:
the slew rate control circuit comprises a plurality of current mode logic circuits; and
the current mode logic circuits receive the clock signals, respectively, and each has at least one adjustable resistor or at least one adjustable capacitor that is controlled by the control signal.

* * * * *